US008863045B1

(12) United States Patent
Chen et al.

(10) Patent No.: US 8,863,045 B1
(45) Date of Patent: Oct. 14, 2014

(54) OPTICAL PROXIMITY CORRECTION METHOD BASED ON HYBRID SIMULATION MODEL

(71) Applicant: Shanghai Huali Microelectronics Corporation, Shanghai (CN)

(72) Inventors: Han Chen, Shanghai (CN); Fang Wei, Shanghai (CN); HsuSheng Chang, Shanghai (CN); Zhihao Chu, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/086,222

(22) Filed: Nov. 21, 2013

(30) Foreign Application Priority Data

Jun. 8, 2013 (CN) .......................... 2013 1 0229404

(51) Int. Cl.
*G06F 17/50* (2006.01)
*G03F 1/36* (2012.01)

(52) U.S. Cl.
CPC .............. *G06F 17/5068* (2013.01); *G03F 1/36* (2013.01)
USPC .......................................................... 716/53

(58) Field of Classification Search
None
See application file for complete search history.

(56) References Cited

U.S. PATENT DOCUMENTS

| 6,584,609 | B1 * | 6/2003 | Pierrat et al. ..................... 716/52 |
| 7,127,699 | B2 * | 10/2006 | Gallatin et al. ................. 716/53 |
| 2003/0061592 | A1 * | 3/2003 | Agrawal et al. ................. 716/19 |
| 2008/0178140 | A1 * | 7/2008 | Lin et al. .......................... 716/19 |

OTHER PUBLICATIONS

Chen et al., "Hybrid OPC verification flow with compact and rigorous models," Photomask and Next-Generation Lithography Mask Technology XIX, 2012 Proc. of SPIE vol. 8441, 7 pages.*
Hung et al., "Hybrid optical proximity correction—concepts and results," 22$^{nd}$ Annual BACUS Symposium on Photomask Technology, 2002 Proc. of SPIE vol. 4889, pp. 1173-1180.*

* cited by examiner

*Primary Examiner* — Leigh Garbowski
(74) *Attorney, Agent, or Firm* — Muncy, Geissler, Olds & Lowe, P.C.

(57) ABSTRACT

An optical proximity correction (OPC) method is disclosed, in which original design patterns are first grouped into a first group and a second group, wherein each pattern of the first group has a size greater than a size of any pattern of the second group. Next, a simple OPC model and a complex OPC model are individually established for the two groups using different numbers of convolution kernels. After that, the simple OPC model and the complex OPC model are combined together to generate a hybrid OPC model which is thereafter used to perform an OPC treatment on the original design patterns. This method is capable of shortening the OPC processing time and increasing the flexibility in utilizing OPC software and hardware resources.

6 Claims, 2 Drawing Sheets

OPTICAL PROXIMITY CORRECTION METHOD BASED ON HYBRID SIMULATION MODEL

CROSS-REFERENCES TO RELATED APPLICATIONS

This application claims the priority of Chinese patent application, number 2013 10229404.3, filed on Jun. 8, 2013, the entire contents of which are incorporated herein by reference.

TECHNICAL FIELD

The present invention relates generally to the field of semiconductor device fabrication, and more particularly to an optical proximity correction (OPC) method.

BACKGROUND

In general terms, a process for fabricating a semiconductor device involves transferring an integrated circuit (IC) layout to a semiconductor chip, which typically includes: first forming the IC layout on a mask to form a mask pattern thereon; and then transferring the mask pattern onto the semiconductor chip.

However, due to continuing shrinkage of critical dimensions of the semiconductor devices as well as resolution limits of exposure tools, a phenomenon referred as optical proximity effect (OPE) is prone to occur when to expose and transfer mask patterns arranged with a high density. This OPE effect can lead to defects when transferring the mask patterns onto the chip, common examples of which include right-angled corner rounding, line end shortening and line-width variations (including both increases and decreases).

For this reason, in the existing photolithographic process, optical proximity correction (OPC) is typically performed on mask patterns prior to mask fabrication to compensate for the optical proximity effect caused by a limited resolution of an optical system employed in the exposure tool. For example, FIG. 1 shows a flow chart illustrating a typical OPC method for mask pattern compensation employed in conventional IC fabrication processes. As illustrated, the OPC method includes: providing data of original design patterns; establishing a single OPC model; modifying the original design patterns with the OPC model; and obtaining data of post OPC patterns.

On the other hand, with sizes of patterns to be exposed continuously decreasing and being reduced to the 65-nm technology node, layout patterns are of higher complexity and hence require an improved OPC compensation accuracy which typically leads to exponential increases in OPC processing time as compared to those at technology nodes of 65 nm and above. The elongation of OPC processing time increases difficulties in controlling and reducing the tape-out cycle time and in optimizing the utilization of OPC hardware and software resources. As can be seen in FIG. 2, with the technology node shrinking from 130 nm to 22 nm, the processing time of each level OPC calculation and simulation increases exponentially, and the smaller the technology node, the sharper the processing time increases and the more times the hardware and software resources are required.

Since such increases in OPC processing time can elongate the tape-out cycle time, there is an urgent need in the art for further optimization of OPC resource utilization and the reduction of OPC processing time.

SUMMARY OF THE INVENTION

Therefore, it is an objective of the present invention to provide an optical proximity correction (OPC) method capable of reducing OPC processing time.

In accordance with the above and further objectives of the invention, an OPC method includes: providing original design patterns; grouping the original design patterns into a first group and a second group, wherein each pattern of the first group has a size larger than a size of any pattern of the second group; establishing a simple OPC model for patterns of the first group with a relatively small number of convolution kernels; establishing a complex OPC model for patterns of the second group with a relatively large number of convolution kernels; combining the simple and complex OPC models to generate a hybrid OPC model; and performing an OPC treatment on the original design patterns based on the hybrid OPC model.

Further, the number of convolution kernels used to establish the simple OPC model may be equal to or smaller than 10.

Further, the number of convolution kernels used to establish the complex OPC model may be equal to or larger than 15.

Further, each pattern of the first group may have a size equal to or greater than 300 nm.

Further, each pattern of the second group may have a size smaller than 300 nm.

Further, the OPC method may further include outputting post OPC design patterns after performing the OPC treatment on the original design patterns.

As described herein, the OPC method of the present invention provides a number of benefits over the prior art OPC method. For example, by grouping the original patterns into the larger-sized ones and smaller-sized ones and establishing individual OPC models for the two pattern groups using different numbers of convolution kernels, the OPC method of the present invention can shorten OPC processing time and increase the flexibility in utilizing OPC software and hardware resources.

DETAILED DESCRIPTION

The present invention will be further described with reference to the following detailed description of exemplary embodiments, taken in conjunction with the accompanying drawings. Features and advantages of the invention will be apparent from the following detailed description, and from the claims. Note that all the drawings are presented in a very simple form and not drawn precisely to scale. They are provided solely to facilitate the description of the exemplary embodiments of the invention in a convenient and clear way.

Figure 1:
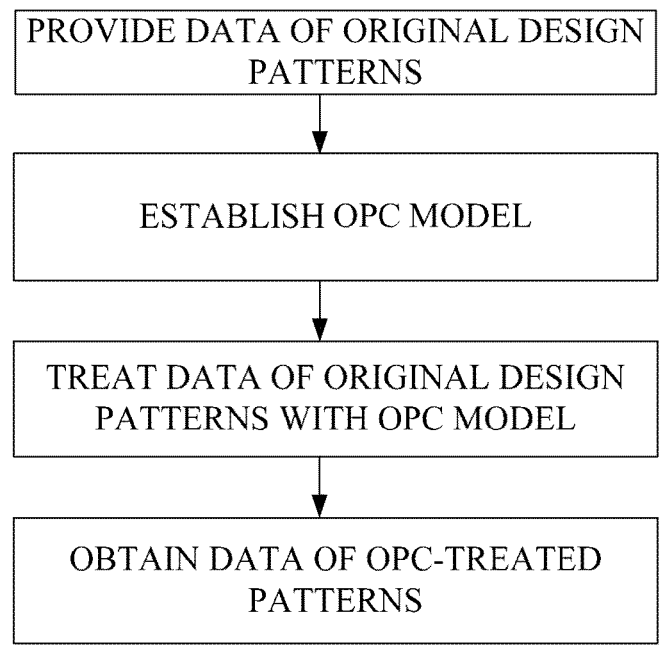
FIG. 1 depicts a flowchart graphically illustrating an OPC method of the prior art.
Figure 2:
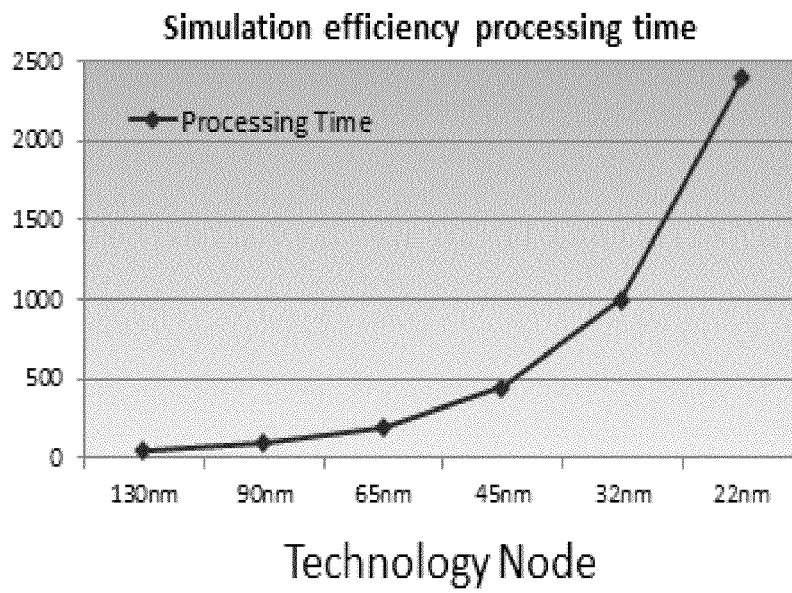
FIG. 2 shows a trend of OPC processing time varying with the shrinkage of technology node.
Figure 3:
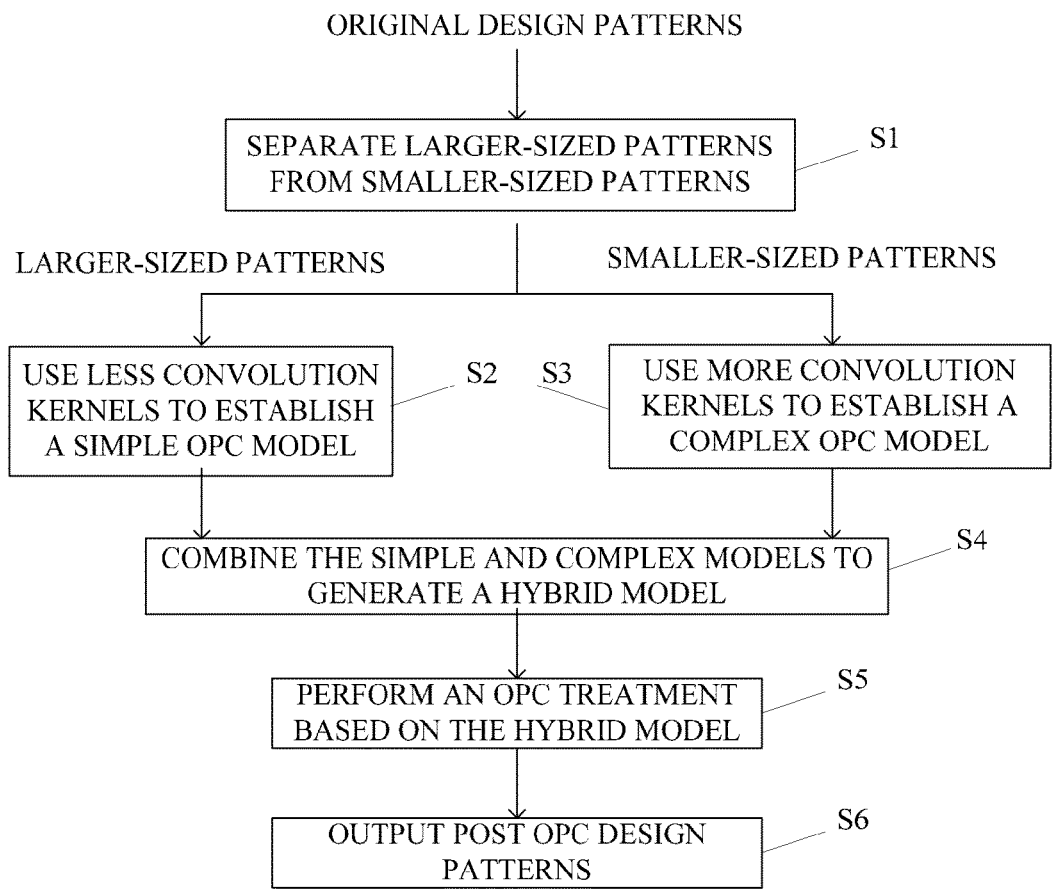
FIG. 3 depicts a flowchart graphically illustrating an OPC method in accordance with one embodiment of the present invention.

FIG. 3 illustrates process steps (S1 to S6) of an optical proximity correction (OPC) method in accordance with one embodiment of the present invention.

In step S1, original design patterns are grouped into a first group and a second group by their sizes.

The original design patterns are of a layout designed for a given semiconductor device fabrication process and provide a basis for wafer fabrication.

The original design patterns are grouped in such a manner that, larger-sized ones are included in the first group while smaller-sized ones are included in the second group.

In practice, the threshold size between the larger-sized patterns and smaller-sized patterns can vary as needed with different IC logics. Preferably, the size of each first group pattern is equal to or greater than 300 nm, whilst the size of each second group pattern is smaller than 300 nm.

In step S2, a simple OPC model is established for the first group patterns using a relatively small number of convolution kernels.

In this embodiment, the number of convolution kernels used to establish the simple OPC model is smaller than 10. As this OPC model is relatively simple and involves a relatively small number of convolution kernels, its calculation will not take much time and the simple OPC model is hence advantageously time-saving. Further, while the simple OPC model may lead to certain deviations within the range of 2 nm in the OPC-compensated patterns, such deviations are tolerable when compared to the sizes of the corresponding first group patterns each of which is not smaller than 300 nm.

In step S3, a complex OPC model is established for the second group patterns using a relatively large number of convolution kernels.

Since each of the second group patterns has a relatively small size, the small-sized patterns of the second group need to be treated with a greater number of convolution kernels to ensure higher correction accuracy. Generally, the number of convolution kernels used to establish the complex OPC model may be equal to or greater than 15.

In step S4, the simple and complex OPC models are combined to generate a hybrid OPC model.

The combination of the simple and complex OPC models into a single model is for adapting them for practical use.

In Step S5, the hybrid OPC model is used to perform an OPC treatment on the original design patterns to reduce OPC processing time and improve production efficiency while maintaining a high accuracy.

Lastly, in step S6, the post OPC design patterns, namely the design patterns obtained after being treated by the hybrid OPC model, are output.

Figure 4:
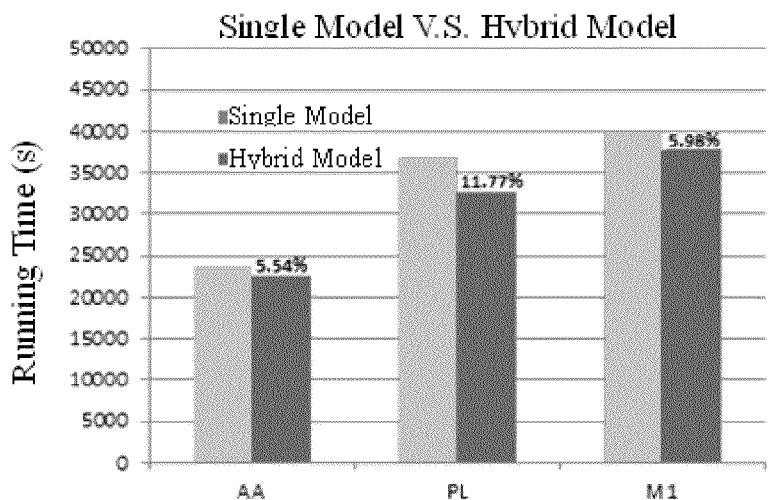
FIG. 4 compares processing times of the hybrid OPC model and the prior-art single OPC model, wherein processing times of the two models for various types of patterns are represented by columns, the heights of which indicate the magnitudes of the processing times.

FIG. 4 compares processing times of the hybrid OPC model of the present invention and the prior-art single model, wherein processing times of the two models for various patterns are represented by columns, the heights of which indicate the magnitudes of the processing times. As illustrated in FIG. 4, the hybrid OPC model of the present invention overall shortens the processing time by 5% to 12%, specifically, by 5.54% for active area patterns (indicated as "AA" in the figure), by 11.77% for polysilicon layer patterns (indicated as "PL"), and by 5.98% for the first metal layer patterns (indicated as "M1").

As indicated above, by grouping the original design patterns into the larger-sized ones and the smaller-sized ones and treating patterns of the two groups with different models, the OPC method of this embodiment gains the advantages as follows: 1) treating the larger-sized group patterns with the simple OPC mode that involves a smaller number of convolution kernels can reduce the OPC processing time; 2) treating the smaller-sized group patterns with the complex OPC mode that involves a larger number of convolution kernels can ensure a higher OPC compensation accuracy; and 3) the hybrid model generated by integrating these two models is overall capable of shortening the OPC processing time and increasing the flexibility in utilizing OPC software and hardware resources.

While certain preferred embodiments of the present invention are described in detail above, the scope of the invention is not to be considered limited by such disclosure. Those skilled in the art can make various modifications, substitutions and the like without departing from the scope of the invention and these are therefore considered to be within the scope of the invention.

What is claimed is:

1. An optical proximity correction (OPC) method, comprising the steps of:
   providing original design patterns;
   grouping the original design patterns into a first group and a second group, wherein each pattern of the first group has a size larger than a size of any pattern of the second group;
   establishing a simple OPC model for patterns of the first group using a relatively small number of convolution kernels;
   establishing a complex OPC model for patterns of the second group using a relatively great number of convolution kernels;
   combining the simple and complex OPC models to generate a hybrid OPC model; and
   performing an OPC treatment on the original design patterns based on the hybrid OPC model.

2. The method of claim 1, wherein the number of convolution kernels used to establish the simple OPC model is equal to or smaller than 10.

3. The method of claim 1, wherein the number of convolution kernels used to establish the complex OPC model is equal to or greater than 15.

4. The method of claim 1, wherein each pattern of the first group has a size equal to or greater than 300 nm.

5. The method of claim 1, wherein each pattern of the second group has a size smaller than 300 nm.

6. The method of claim 1, further comprising outputting post OPC design patterns after performing the OPC treatment on the original design patterns.

* * * * *